US009465208B2

(12) United States Patent
Vogt et al.

(10) Patent No.: US 9,465,208 B2
(45) Date of Patent: Oct. 11, 2016

(54) FACET MIRROR DEVICE

(71) Applicant: Carl Zeiss SMT GmbH, Oberkochen (DE)

(72) Inventors: Martin Vogt, Mutlangen (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 380 days.

(21) Appl. No.: 14/108,487

(22) Filed: Dec. 17, 2013

(65) Prior Publication Data
US 2014/0104589 A1 Apr. 17, 2014

Related U.S. Application Data

(63) Continuation of application No. PCT/EP2011/060358, filed on Jun. 21, 2011.

(51) Int. Cl.
*G03B 27/54* (2006.01)
*G02B 26/08* (2006.01)
*G02B 7/182* (2006.01)
*G03F 7/20* (2006.01)

(52) U.S. Cl.
CPC ......... *G02B 26/0816* (2013.01); *G02B 7/1821* (2013.01); *G03F 7/70075* (2013.01); *G03F 7/70116* (2013.01)

(58) Field of Classification Search
CPC ........... G03F 7/70075; G03F 7/70116; G03F 7/70141; G02B 26/0816; G02B 7/1821
USPC ........................................................ 355/67
See application file for complete search history.

(56) References Cited

U.S. PATENT DOCUMENTS

| 5,668,655 | A | 9/1997 | Schweizer et al. | |
|---|---|---|---|---|
| 2005/0030653 | A1* | 2/2005 | Holderer et al. | G02B 5/09 359/872 |
| 2012/0044474 | A1 | 2/2012 | Hauf et al. | |
| 2012/0105989 | A1 | 5/2012 | Buis et al. | |
| 2014/0022658 | A1 | 1/2014 | Ziegler et al. | |
| 2014/0211187 | A1 | 7/2014 | Hauf et al. | |

FOREIGN PATENT DOCUMENTS

| DE | 102 05 425 A1 | 5/2003 |
|---|---|---|
| EP | 0 726 479 A2 | 8/1996 |

(Continued)

OTHER PUBLICATIONS

International Search Report for corresponding PCT Appl No. PCT/EP2011/060358, dated Feb. 13, 2012.

(Continued)

*Primary Examiner* — Peter B Kim
(74) *Attorney, Agent, or Firm* — Fish & Richardson P.C.

(57) ABSTRACT

A facet mirror device includes a facet element, a support device and a clamping device. The facet element includes a first support section, while the support device comprises a second support section contacting the first support section to support the facet element. The clamping device includes a tensioning element, a first end of the tensioning element being connected to the facet element a second end of the tensioning element being connected to a counter unit. The counter unit includes a third support section, the support device including a fourth support section contacting the third support section to support the counter unit.

25 Claims, 4 Drawing Sheets

(56) References Cited

FOREIGN PATENT DOCUMENTS

| JP | H 07-199038 A | 8/1995 |
|---|---|---|
| JP | H 09-68661 A | 3/1997 |
| JP | 2004-246052 A | 9/2004 |
| JP | 2005-508520 A | 3/2005 |
| JP | 2005-517291 A | 6/2005 |
| JP | 2012-506135 A | 3/2012 |
| JP | 2012-531759 A | 12/2012 |
| JP | 2014-515881 A | 7/2014 |
| WO | WO 2010/049076 | 5/2010 |
| WO | WO 2011/000671 | 1/2011 |

OTHER PUBLICATIONS

Japanese Office Action, with translation therein, for corresponding JP Appl No. 2014-516203, dated Mar. 24, 2015.

* cited by examiner

FACET MIRROR DEVICE

BACKGROUND OF THE INVENTION

The invention relates to a facet mirror device that may be used within an optical device used in exposure processes, in particular in microlithography systems. It further relates to an optical imaging arrangement comprising such a facet mirror device. It further relates to a method of supporting a facet element of a facet mirror device. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical element modules comprising optical elements, such as lenses, mirrors, gratings etc., in the light path of the optical system. Those optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element units. Facet mirror devices as the ones mentioned above, among others may serve to homogenize the exposure light beam, i.e. to effect a power distribution within the exposure light beam which is as uniform as possible. They may also be used to provide any desired specific power distribution within the exposure light beam.

Due to the ongoing miniaturization of semiconductor devices there is not only a permanent need for enhanced resolution but also a need for enhanced accuracy of the optical systems used for fabricating those semiconductor devices. This accuracy obviously not only has to be present initially but has to be maintained over the entire operation of the optical system. A particular problem in this context is proper heat removal from the optical components to avoid uneven thermal expansion of these components leading to uneven deformation of these components and, ultimately, to undesired imaging errors As a consequence highly sophisticated facet mirror devices have been developed such as they are disclosed, for example, in DE 102 05 425 A1 (Holderer et al.), the entire disclosure of which is incorporated herein by reference.

DE 102 05 425 A1 (Holderer et al.), among others, shows facet mirror devices where facet elements with a spherical rear surface sit in an associated recess within a support element. The spherical rear surface rests against a corresponding spherical wall or a plurality of contact points of the support element confining this recess. The spherical rear surface has a comparatively small radius of curvature such that it defines a center of rotation of the facet element that is located far remote from a center of curvature of the optical surface of the facet element.

A manipulating lever is centrally connected to the rear surface of the facet element and corresponding manipulators tilt the manipulating lever, i.e. generate lateral excursions of the free end of the manipulating lever, to adjust both the position and the orientation of the optical surface of the facet element.

This configuration, however, has the disadvantage that an adjustment of the orientation of the optical surface of the facet element by tilting the manipulating lever typically leads to a frictional relative motion between the facet element and the support element. This frictional relative motion leads to the introduction of undesired parasitic forces and moments, respectively, into the facet element.

Furthermore, in some cases, the manipulating lever is used as a tensioning element for fixing the facet element relative to the support element once it has been adjusted through a clamping force pressing the facet element against the support element. To this end, a spring device contacting the support element acts on the free end of the manipulating lever to put the latter under tension along its longitudinal axis thereby pressing the facet element against the support element.

Such a clamping connection, compared to an adhesive connection, has the advantage that it may be easily achieved and also released for re-adjustment, and that it is free from undesired effects such as glue shrinkage (leading to an introduction of parasitic stresses into the facet element) and outgassing of contaminants.

The clamping configuration disclosed in DE 102 05 425 A1 (Holderer et al.), however, has the disadvantage that, depending on the degree of rotation about the center of rotation defined by the spherical rear surface, either one of the end of the spring device contacting the manipulating lever and the manipulating lever is laterally deflected. Hence, the tensioning force generated by the spring device has a component in a direction transverse to the longitudinal axis of the manipulating lever. As a consequence, the laterally deflected spring device and the bent manipulating lever generate a resetting moment about the center of rotation counteracting the adjustment motion. This results in undesired parasitic moments introduced into the facet element via the manipulating lever.

SUMMARY OF THE INVENTION

It is thus an object of the invention to, at least to some extent, overcome the above disadvantages and to allow well defined adjustment of the facet element to the desired position and orientation with respect to the support element while at least largely avoiding undesired parasitic forces and moments, respectively, in particular caused by frictional or resetting forces and moments, respectively.

This and other objects are achieved according to the invention which, on the one hand, is based on the teaching that it is possible to provide a simple and reliable, easily adjustable support to the facet element at least largely avoiding undesired parasitic forces and moments, respectively, if a clamping arrangement is used wherein a counter unit is introduced via which the free end of the tensioning element is supported on the support unit and which is arranged such that an axis of rotation of the counter unit with respect to the support device is defined which is located at least close to an axis of rotation of the facet element with respect to the support device.

This configuration has the advantage that (depending on the distance between the axis of rotation of the counter unit and the axis of rotation of the facet element) the counter unit may follow the rotation of the facet element such that bending of the tensioning element and, eventually, lateral deflection of a spring device is at least largely avoided, thereby at least largely avoiding introduction of undesired parasitic forces and moments, respectively, into the facet element.

It will be appreciated that such a configuration may be designed such that it allows at least largely frictionless relative adjustment motion of the clamping partners by temporarily relieving the clamping partners from the clamping force, e.g. using a pressurized fluid.

Furthermore, it will be appreciated that at least largely frictionless well defined relative adjustment motion of the clamping partners may be achieved if the support of the clamped facet element itself is designed such that the adjustment motion of the clamped facet element is at least largely frictionless while providing a well defined center of rotation.

Thus, according to a first aspect of the invention there is provided a facet mirror device comprising a facet element, a support device and a clamping device. The facet element comprises a first support section, while the support device comprises a second support section contacting the first support section to support the facet element. The clamping device comprises a tensioning element, a first end of the tensioning element being connected to the facet element a second end of the tensioning element being connected to a counter unit. The counter unit comprises a third support section, the support device comprising a fourth support section contacting the third support section to support the counter unit. The tensioning element, in a clamping state, is under tensile stress such that the first support section and the second support section are pressed against each other and the third support section and the fourth support section are pressed against each other in a clamping direction to clamp the facet element via a clamping force in a given position and orientation. The first support section and the second support section define at least a first axis of rotation of a relative motion between the first support section and the second support section, the first axis of rotation extending in a first plane transverse to the clamping direction. The third support section and the fourth support section define a second axis of rotation of a relative motion between the third support section and the fourth support section, the second axis of rotation extending in a second plane transverse to the clamping direction. The first axis of rotation and the second axis of rotation are located at least close to each other.

According to a second aspect of the invention there is provided a method of supporting a facet element of a facet mirror device comprising providing a facet element, a support device and a clamping device, the facet element comprising a first support section, the support device comprising a second support section contacting the first support section to support the facet element. The method further comprises connecting a first end of a tensioning element of the clamping device to the facet element and connecting a second end of the tensioning element to a counter unit of the clamping device, the counter unit comprising a third support section contacting a fourth support section of the support device. The method further comprises, in a clamping step, putting the tensioning element under tensile stress such that the first support section and the second support section are pressed against each other and the third support section and the fourth support section are pressed against each other in a clamping direction to clamp the facet element via a clamping force in its position and orientation. The method further comprises, in an adjustment step, relieving at least one of the first support section and the second support section and the third support section and the fourth support section from the clamping force, and adjusting the facet element to a given position and a given orientation.

According to a third aspect of the invention there is provided a facet mirror device comprising a facet element, a support device and a clamping device. The facet element comprises a first support section, while the support device comprises a second support section contacting the first support section to support the facet element. The clamping device comprises a tensioning element, a first end of the tensioning element being connected to the facet element, a second end of the tensioning element being connected to a counter unit. The counter unit comprises a third support section, the support device comprising a fourth support section contacting the third support section to support the counter unit. The tensioning element, in a clamping state, is under tensile stress such that the first support section and the second support section are pressed against each other and the third support section and the fourth support section are pressed against each other to clamp the facet element in at least one of a given position and a given orientation. At least one of the second support section and the fourth support section defines an axis of rotation of the facet element, at least one of the second support section and the fourth support section further allowing substantially frictionless rotation of the facet element about the axis of rotation. The axis of rotation, in particular, is located at least close to an optical surface of the facet element.

According to a fourth aspect of the invention there is provided an optical imaging arrangement comprising a mask unit adapted to receive a pattern, a substrate unit adapted to receive a substrate, an illumination unit adapted to illuminate the pattern, an optical projection unit adapted to transfer, in an exposure step, an image of the pattern onto the substrate. At least one of the illumination unit and the optical projection unit comprises a facet mirror device according to the invention.

Further aspects and embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

In the following, a first preferred embodiment of an optical imaging arrangement 101 according to the invention will be described with reference to FIGS. 1 to 10. In order to facilitate the explanations given below an xyz-coordinate system has been introduced into the Figures and will be used throughout the following description. In the following, the z-direction designates the vertical direction (i.e. the direction of the gravitational force). However, it will be appreciated that, with other embodiments of the invention, any other orientation in space of this xyz-coordinate system and the components of the optical imaging arrangement, respectively, may be chosen.

Figure 1:
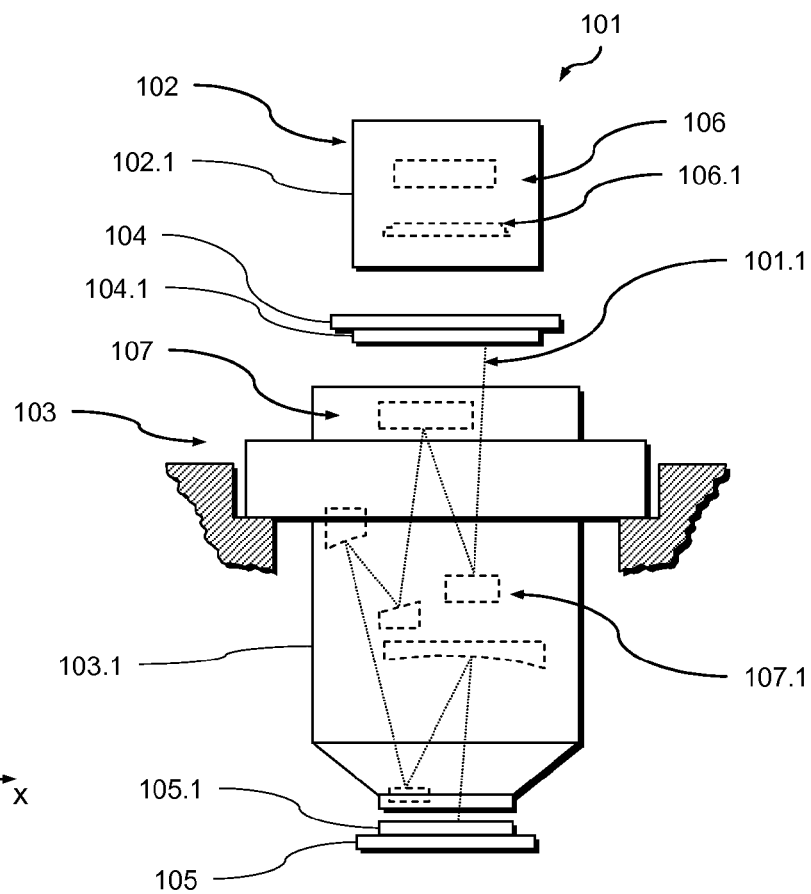
FIG. 1 is a schematic representation of a preferred embodiment of an optical imaging arrangement according to the invention which comprises a preferred embodiment of a facet mirror device according to the invention and with which preferred embodiments of the method according to the invention may be executed.

FIG. 1 is a schematic and not-to-scale representation of the optical imaging arrangement in the form of an optical exposure apparatus 101 used in a microlithography process during manufacture of semiconductor devices. The optical exposure apparatus 101 comprises an illumination unit 102 and an optical projection unit 103 adapted to transfer, in an exposure process, an image of a pattern formed on a mask 104.1 of a mask unit 104 onto a substrate 105.1 of a substrate unit 105. To this end, the illumination unit 102 illuminates the mask 104.1. The optical projection unit 103 receives the light coming from the mask 104.1 and projects the image of the pattern formed on the mask 104.1 onto the substrate 105.1, e.g. a wafer or the like.

The illumination unit 102 comprises an optical element system 106 (only shown in a highly simplified manner in FIG. 1) including a plurality of optical element units such as optical element unit 106.1. As will be explained in further detail below, the optical element unit 106.1 is formed as a preferred embodiment of a facet mirror device according to the invention. The optical projection unit 103 comprises a further optical element system 107 including a plurality of optical element units 107.1. The optical element units of the optical element systems 106 and 107 are aligned along a folded optical axis 101.1 of the optical exposure apparatus 101.

In the embodiment shown, the optical exposure apparatus 101 operates using light in the EUV range at a wavelength between 5 nm to 20 nm, more precisely at a wavelength of about 13 nm. Thus, the optical elements used within the illumination unit 102 and the optical projection unit 103 are exclusively reflective optical elements. However, it will be appreciated that, with other embodiments of the invention working at different wavelengths, any type of optical elements (refractive, reflective or diffractive) may be used alone or in an arbitrary combination. The optical element system 107 may comprise a further facet mirror device according to the invention.

Figure 2:
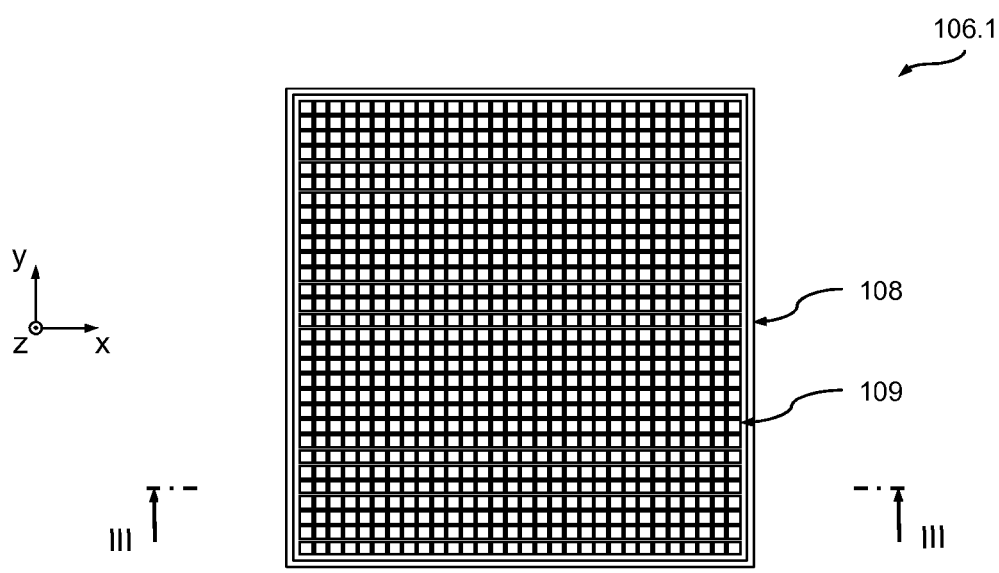
FIG. 2 is a schematic top view of the facet mirror device of FIG. 1.
Figure 3:
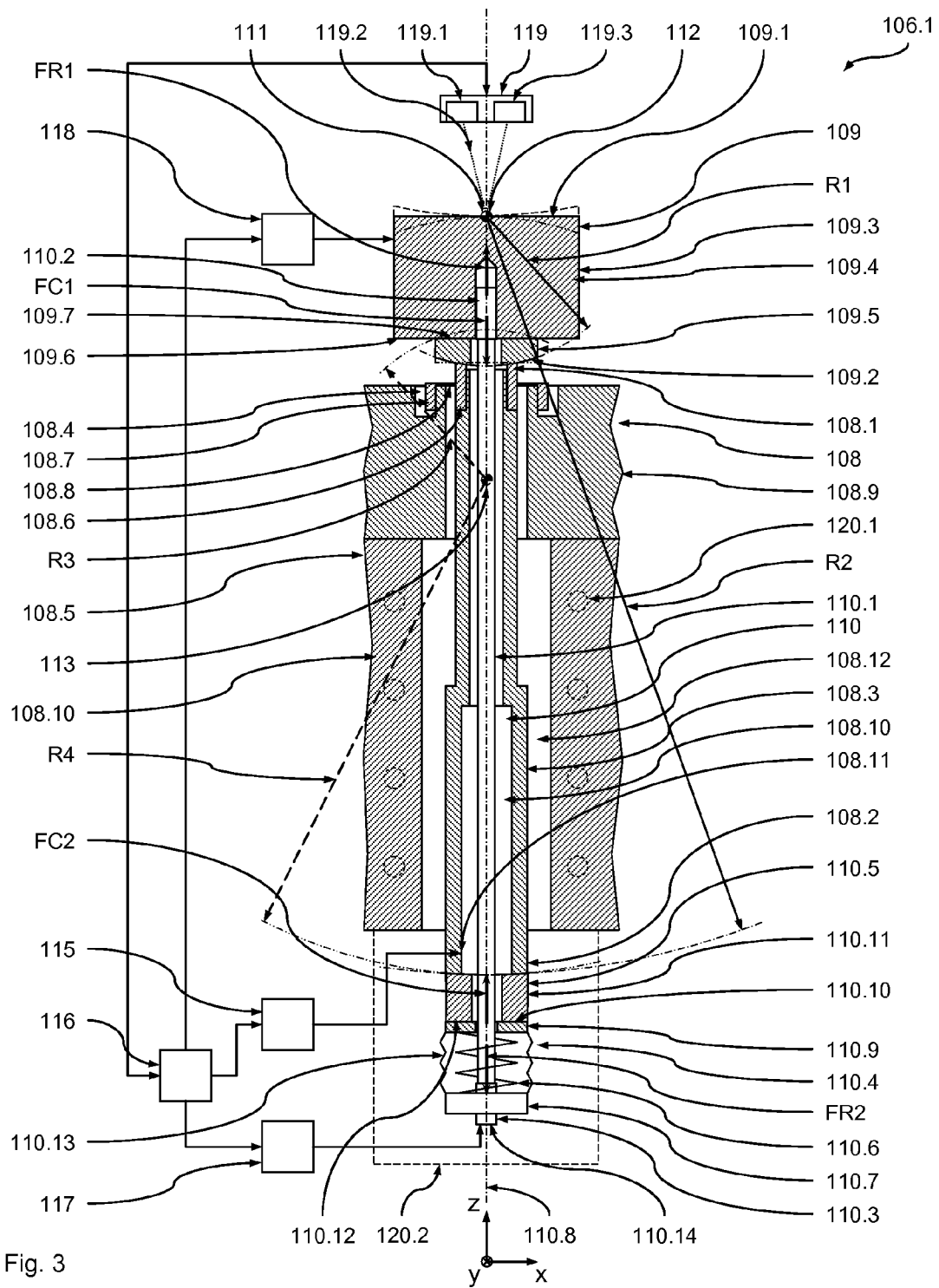
FIG. 3 is a schematic sectional representation of a part of the facet mirror device of FIGS. 1 and 2 (along line of FIG. 2)

As can be seen from FIGS. 2 and 3, the facet mirror device 106.1 comprises a support device in the form of a support unit 108 supporting a plurality of facet elements 109 (only one of which is shown in FIG. 3). In the embodiment shown 900 facet elements 109 are supported on the support unit 108. However, it will be appreciated that, with other embodiments of the invention, at any other number of facet elements 109 may be carried by the support unit 108. For example, with certain preferred embodiments of the invention, up to 2000 facet elements 109 or even more are supported on the support unit 108. It should be noted that, preferably, as many facet elements 109 as possible are supported on the support unit 108 to obtain homogenization of the illumination light. Numbers of up to 4000 facet elements 109, more preferably, up to 16000 facet elements 109 may be realized.

In the embodiment shown, the facet elements 109 are arranged such that a small gap of less than 0.05 mm is left between them. Hence, as can be seen in particular from FIG. 2, a regular rectangular matrix of facet elements 109 is formed on the support unit 108 providing a minimum amount of loss in radiant power. However, it will be appreciated that, with other embodiments of the invention, any other arrangement of facet elements may be chosen according to the optical needs of the imaging device, the facet mirror device is used for.

As can be further seen from FIGS. 2 and 3, in particular from FIG. 2, each facet element 109, in a top view (along the z-direction), as an outer contour of substantially rectangular shape, more precisely of substantially squared shape. However, with other embodiments of the invention, any other geometry of this outer contour may be chosen such as, for example, an arbitrarily curved outer contour, a circular outer contour, an elliptic outer contour, a polygonal outer contour or arbitrary combinations thereof.

In the embodiment shown, each facet element 109 has a substantially planar front surface 109.1, a convex rear surface 109.2 and a lateral surface 109.3. The front surface 109.1 is a reflective surface optically used during operation of the optical imaging arrangement 101 in order to provide homogenization of the illumination light provided by the illumination unit 102. The reflective surface 109.1 may be provided via a reflective coating applied to the front surface 109.1 which is adapted to the wavelength of the illumination light used (typically, in order to provide maximum reflectivity at the respective wavelength). With certain embodiments of the invention a reflective grating may be provided at the front surface of the facet elements.

In the embodiment shown, the front surface 109.1 is a planar surface. However, it will be appreciated that, with other embodiments of the invention, any other shape of the front surface may be chosen depending on the optical task to be performed by the facet mirror device. Hence, apart from such planar surfaces, spherical as well as aspherical surfaces as well as arbitrary combinations thereof may be used. Furthermore, concave as well as convex front surfaces may also be used (as is indicated by the dashed contours in FIG. 3).

Furthermore, it should be noted that the optically usable front surface 109.1 of the facet element 109 may be of any suitable size. Preferably, the size of the front surface 109.1 ranges from 10 mm$^2$ to 400 mm$^2$, in particular from 50 mm$^2$ to 150 mm$^2$, more preferably from 90 mm$^2$ to 110 mm$^2$.

As can be seen best from FIG. 3, the facet element 109, in the embodiment shown, comprises a facet body 109.4 forming the optical front surface 109.1 of the facet element 109 and a separate intermediate element 109.5 forming the rear surface 109.2 of the facet element 109. It will be appreciated however that, with other embodiments of the invention, the facet element may be a monolithic component. Likewise, with other embodiments, the facet element may comprise further components beyond the facet body and the intermediate element.

In the embodiment shown, the rear surface 109.2 of the intermediate element 109.5 forms a first support section contacting an adjacent second support section 108.1 of the support unit 108. As will be explained in further detail below, the facet element 109 is held in place via a clamping device 110. To this end, the clamping device 110 comprises an elongated tensioning element 110.1 which, at a first end 110.2, is fixedly connected to the facet element body 109.4.

The tensioning element 110.1, in a clamping state (as it is shown in FIG. 3), is under a tensile stress such that it generates a first clamping force FC1 pressing the first support section 109.2 (i.e. the rear surface of the facet element 109) against the second support section 108.1 of the support unit 108 in a first clamping direction (namely the direction of the first clamping force FC1), thereby holding the facet element 109 in place.

The tensioning element 110.1, in the embodiment shown, is an elongated, slender rod shaped element made of a highly elastic material, such as for example spring steel on the like. It will be appreciated however, that with other embodiments of the invention, any other suitable and desired type of tensioning element may be chosen which provides sufficient elasticity and sufficiently high first clamping forces FC1 for keeping the facet element in place under the static and, in particular, the dynamic loads to be expected during operation of the imaging arrangement 101. More precisely, any desired elastic pull mechanism (i.e. any mechanism able to transmit tensile stresses but not necessarily compressive stresses), such as elastic wires, cables, as well as leaf springs, helical springs etc. may be used.

To generate the tensile stress within the tensioning element 110.1, a second end 110.3 of the tensioning element 110.1 is connected to a counter unit 110.4 of the clamping device 110. The counter unit 110.4 forms a third support section 110.5 contacting a fourth support section 108.2 of the support device 108.

The fourth support section 108.2 is formed at a connector section 108.3 of the support device 108 connecting the second support section 108.1 and the fourth support section 108.2. Hence, in the clamping state, the tensioning element 110.1 is put under tensile stress such that also the third support section 110.5 and the fourth support section 108.2 are pressed against each other by a second clamping force FC2 acting in a second clamping direction.

It will be appreciated that, in the clamping state as shown in FIG. 3, the second clamping force FC2 is acting between the third support section 110.5 of the counter unit 110.4 and the fourth support section 108.2 of the support unit 108 such that, apart from the facet element 109, also the counter unit 110.4 is held in place relative to the support unit 108.

It will be further appreciated that, as a general rule, the elastic properties and/or dimensions of the components of this clamping arrangement are selected such that the respective clamping force FC1 and FC2 generated is adapted to the static and, in particular, the dynamic loads to be expected during (normal) operation of the imaging apparatus 101, thereby ensuring that the facet element 109 is held in a position and orientation it has been adjusted to under any of these load situations to be expected during (normal) operation of the imaging apparatus 101.

In the present embodiment, the respective clamping force FC1, FC2 may be adjusted via a spring element 110.6 of the counter unit 110.4 arranged and acting between the third support section 110.5 and a force transmission element 110.7 connected to the second end 110.3 of the tensioning element 110.1.

In the present embodiment, the second end 110.3 is provided with a threaded section, the force transmission element 110.7 being threaded onto this threaded section of the second end 110.3. Hence, simply by advancing or retracting the force transmission element 110.7 along the threaded section the degree of compression of the spring element 110.6 may be modified thereby adjusting the clamping force FC exerted in the clamping state.

It will be appreciated however that, with other embodiments of the invention, adjustment of the clamping forces FC1, FC2 may be achieved by any other suitable mechanism. For example, spacers or the like may be placed between the spring element 110.6 and either one of the force transmission element 110.7 and the third support section 110.5 to modify the compression of the spring element 110.6 and, hence, the clamping forces FC1, FC2. Furthermore, the possibility to modify the length (in the respective clamping direction) of either of the tensioning element 110.1 and any component arranged mechanically in parallel to the tensioning element 110.1 (such as, for example, the connector section 108.3 and the third support section 110.5) may be provided by a suitable mechanism (e.g. by a suitable telescopic design etc.).

As can be seen from FIG. 3, in the present example, the first support section 109.2 and the second support section 108.1 both define curved contact surfaces which, in turn, define a first center of rotation 111 of the relative motion of the facet element 109 with respect to the support unit 108.

In the embodiment shown, the first support section 109.2 and the second support section 108.1 both define mutually matching spherical contact surfaces having a first radius of curvature R1 such that the first center of rotation 111 is located at the center of the respective spherical contact surface. Hence, the first support section 109.2 and the second support section 108.1, in the manner of a spherical bearing, allow relative rotational motion between the facet element 109 and the support unit 108 about arbitrary rotational axes.

It will be appreciated however that, with other embodiments of the invention, a specific first rotational axis having a given orientation in space may be defined by the first and second support section. For example, the first and second support section might define mutually matching cylindrical contact surfaces such that the first axis of rotation would be the axis of the respective cylindrical contact surface (the first center of rotation then being an arbitrary point on the first axis of rotation). The first axis of rotation would then extend in a plane running transverse to the first clamping direction.

It will be further appreciated that, with other embodiments of the invention, in order to define the corresponding first axis or center of rotation, respectively, it may be sufficient that only one of the first support section and the second support section defines a corresponding curved surface, while the other one simply defines a planar surface or one or more edges contacting the curved counterpart.

As can be seen further from FIG. 3, in the present example, in a similar manner the third support section 110.5 and the fourth support section 108.2 also both define curved contact surfaces which, in turn, define a second center of rotation 112 of the relative motion of the counter unit 110 with respect to the support unit 108.

In the embodiment shown, the third support section 110.5 and the fourth support section 108.2 both define mutually matching spherical contact surfaces having a second radius of curvature R2 such that the second center of rotation 112 is located at the center of the respective spherical contact surface. Hence, the third support section 101.2 and the fourth support section 108.2, also in the manner of a spherical bearing, allow relative rotational motion between the counter unit 110 and the support unit 108 about arbitrary rotational axes.

It will be appreciated however that, with other embodiments of the invention, here as well, a specific second rotational axis having a given orientation in space may be defined by the third and fourth support section. For example, the third and fourth support section might define mutually matching cylindrical contact surfaces such that the second axis of rotation would be the axis of the respective cylindrical contact surface (the second center of rotation then being an arbitrary point on the second axis of rotation). The second axis of rotation would then extend in a plane running transverse to the second clamping direction.

It will be further appreciated that, with other embodiments of the invention, in order to define the corresponding second axis or center of rotation, respectively, it may be sufficient that only one of the third support section and the fourth support section defines a corresponding curved surface, while the other one simply defines a planar surface or one or more edges contacting the curved counterpart.

As can be seen from FIG. 3, the dimensions of the facet element 109, the support unit 108 and the clamping device 110 are selected such that the first center of rotation 111 and the second center of rotation 112 substantially coincide.

Such a configuration has the great advantage that, in an adjustment situation, where the first support section 109.2 and the second support section 108.1 as well as the third support section 110.5 and the fourth support section 108.2 are relieved from the clamping forces FC1, FC2 of the tensioning element 110.1, the facet element 109 and the counter unit 110.4 may execute synchronous rotational motion about the substantially coinciding first and second center of rotation 111, 112 and substantially coinciding first and second axes of rotation, respectively, to adjust the orientation of the facet element 109 (in particular, about the x-axis and/or the y-axis).

Such a synchronous rotational motion about coinciding first and second centers of rotation 111, 112 and substantially coinciding first and second axes of rotation, respectively, avoids the generation of an inclination between the first and second clamping directions or the first and second clamping forces FC1, FC2, respectively. In other words, by this approach, the first and second clamping forces FC1 and FC2 may be kept to be substantially collinear as it is shown in FIG. 3.

Maintenance of the first and second clamping forces FC1 and FC2 in a substantially collinear arrangement has the advantage that that no resetting forces or moments are generated which otherwise would tend to counteract the adjustment motion that has been performed and would introduce undesired parasitic forces or moments into the facet element.

In the embodiment shown, such resetting forces and moments would result from a bending deflection of the tensioning element 110.1 about a bending axis running transverse to its longitudinal axis 110.8. However, since due to the synchronous rotational motion, the first and second clamping forces FC1 and FC2 are maintained in a substantially collinear arrangement such that no such bending of the tensioning element 110.1 (leading to the introduction of undesired parasitic forces or moments into the facet element) may occur in such an adjustment of the orientation of the facet element 109 (in particular, about the x-axis and/or the y-axis).

It will be appreciated that, with other embodiments of the invention, a slight deviation between the location of the first and second center of rotation may be provided or accepted, respectively. The same applies to the location and/or orientation (in particular, the collinear or at least the parallel arrangement) of the first and second axes of rotation, in particular in cases where such specific axes of rotation are provided (as it has been outlined above in the context of embodiments with cylindrical contact surfaces). It will be appreciated that the degree of the respective deviation also defines the degree to which parasitic forces and moments are introduced into the facet element.

As can be further seen from FIG. 3, the facet body forms a fifth support section 109.6 with a substantially planar contact surface contacting a matching substantially planar contact surface of a sixth support section 109.7 of the intermediate element 109.5. Likewise the counter unit 110.4 comprises a first counter element 110.9 forming a seventh support section 110.10 and a second counter element 110.11 forming the third support section 110.5 and an eight support section 110.12 with a substantially planar contact surface contacting a matching substantially planar contact surface of the seventh support section 110.10.

Hence, the tensioning element 110.1 being under tensile stress in the clamping state as outlined above also provides that the fifth support section 109.6 and the sixth support section 109.7 are pressed against each other to clamp the facet body 109.4 in a given position and orientation. Similar applies to the seventh support section 110.10 and the eighth support section 110.12.

The contact surfaces of the fifth support section 109.6, the sixth support section 109.7, the seventh support section 110.10 and the eighth support section 110.12 are arranged to be substantially parallel such that, in the adjustment situation mentioned above, where they are relieved from the clamping forces FC1, FC2 of the tensioning element 110.1, the facet body 109.4 and the first counter element 110.9 may execute synchronous parallel translational motion with respect to the support unit 108.

Such a configuration has the great advantage that, in the adjustment situation, where the first to eighth support section are relieved from the clamping forces FC1, FC2, the facet body 109.4 and the first counter element 110.9 may execute parallel and synchronous translational motion (in particular along the x-axis and/or the y-axis) also avoiding the generation of an inclination between the first and second clamping directions or the first and second clamping forces FC1, FC2, respectively. In other words, by this approach, the position of the facet body 109.4 (in particular along the x-axis and/or the y-axis) may be adjusted while at the same time keeping the first and second clamping forces FC1 and FC2 in a substantially collinear arrangement as is shown in FIG. 3.

Hence, when adjusting the position of the facet body 109.4 (in particular along the x-axis and/or the y-axis), resetting forces or moments resulting from a bending deflection of the tensioning element 110.1 about a bending axis running transverse to its longitudinal axis 110.8 may be avoided.

Preferably, the contact surfaces of the fifth support section 109.6, the sixth support section 109.7, the seventh support section 110.10 and the eighth support section 110.12 are arranged to be substantially perpendicular to the longitudinal axis 110.8 of the tensioning element 110.1. By this approach shear forces acting in the respective plane of contact and tending to dislocate the mating components (in particular under dynamic loading) may be avoided.

It will be further appreciated that, with other embodiments, a certain inclination of the fifth to eighth support section deviating from 90° with respect to the longitudinal axis of the tensioning element may be selected in order to provide the possibility to adjust the position of the facet body, in particular the optical surface of the facet body, along the longitudinal axis of the tensioning element (i.e. in the z-direction). It will be further appreciated that, to this end, further separate components of the facet element and the counter unit, respectively, may be provided providing corresponding pairs of contact surfaces having such an orientation. It will be further appreciated that adjustment of the position of the optical surface 109.1 in the longitudinal direction of the tensioning element (i.e. in the z-direction of FIG. 3) may also be provided via intermediate elements 109.5 having different dimensions in this direction or via further spacer elements (having different dimensions) inserted between the intermediate element 109.5 and the facet body 109.4.

It will be further appreciated that, here again, with other embodiments of the invention, a slight deviation between the orientation of the contact surfaces of the fifth support section 109.6, the sixth support section 109.7, the seventh support section 110.10 and the eighth support section 110.12 may be provided or accepted, respectively. It will be appreciated that the degree of the respective deviation also defines the degree to which parasitic forces and moments are introduced into the facet element.

It will be appreciated that, with the present invention, the first and second center of rotation 111, 112 and the first and second axis of rotation, respectively, may be placed at any desired position. This may be done as a function of the orientation adjustment to be achieved. For example, in the embodiment shown in FIG. 3, the first and second center of rotation 111, 112 are located in the plane of the optical surface 109.1. This has the advantage that, when providing the adjustment motion about the first and second center of rotation 111, 112, the position of the optical surface 109.1 along the x-, y- and z-axis does not change. Hence, exclusive adjustment of the orientation of the optical surface 109.1 (i.e. the rotation about the x-, y- and z-axis) may be achieved.

However, with certain embodiments of the invention, it may also be provided that the first and second center of rotation and the first and second axis of rotation, respectively, are located at a certain distance from the optical surface of the facet element. In such a case, an adjustment of the orientation of the facet element will typically result in a more or less pronounced modification of the position of the optical surface. However in one special case, where the first and second center of rotation and the first and second axis of rotation, respectively, coincide with the center of curvature of a curved optical surface of the facet element having constant curvature (i.e. in the case of a spherical or a cylindrical optical surface), the position of the optical surface remains substantially constant (depending on the manufacturing accuracy of the optical surface).

It will be further appreciated that the first and second center of rotation and the first and second axes of rotation, respectively, do not have to be located on the side of the first and second contact section facing away from the counter unit as it is shown in FIG. 3. They may be located at any desired point. In particular, they may be located at a point between the first and second contact section and the third and fourth contact section as it is indicated in FIG. 3 by the dashed contour 113.

In this case, the contact surfaces between the facet body 109.4 and the intermediate element 109.5 may be provided with a third radius of curvature R3, while the third and fourth contact section are provided with a fourth radius of curvature R4 as it is indicated in FIG. 3.

It will be further appreciated that, depending on the adjustment motion to be achieved, it is also feasible that the first and second center of rotation and the first and second axes of rotation, respectively, are located on the side of the third and fourth contact section facing away from the facet element.

As can be seen from FIG. 3, the second support section 108.1 is formed that by a linking element 108.4 which, in the present embodiment, is rotatably connected to a base unit 108.5 of the support unit 108. To this end, the linking element 108.4 comprises a cylindrical inner linking part 108.6 forming the second support section 108.1. The inner linking part 108.6 is connected to a concentric outer linking part 108.7 via a flexure part 108.8. The flexure part 108.8 may be formed by a membrane element or a plurality of separate flexures (e.g. a plurality of leaf spring elements or the like). In an initial state as shown in FIG. 3, the longitudinal axes of the inner linking part 108.6 and of the outer linking part 108.7 are collinear with the longitudinal axis 110.8 of the tensioning element 110.1.

The connection between the support element 108.4 and the base unit 108.5 is such that the linking element 108.4 may be rotated about the axis of the outer support part 108.7. Hence, basically, after the position and orientation of the facet element 109 has been adjusted via the first to eighth support section as outlined above, the orientation of the facet element 109 may still be (fine) adjusted by rotating the linking element 108.4 with respect to the base unit 108.5.

Furthermore, the elastic properties of the flexure part 108.8 provide the possibility to perform a further (fine) adjustment of the position and/or orientation of the optical surface 109.1 (in up to all six degrees of freedom).

It will be appreciated however that, with other embodiments of the invention, the possibility to provide such (fine) adjustment of the position and/or orientation of the optical surface 109.1 may be omitted for at least some of the six degrees of freedom. For example, a substantially rigid or a monolithic connection may be provided between the linking element and the base plate element. In particular, such a separate linking element may also be omitted providing a substantially rigid connection between the second support section 108.1 and the base unit 108.5.

However, if such a (fine) adjustment in up to six degrees of freedom via the linking element 108.4 is provided, it may also be provided that the facet element 109 is subsequently locked in the adjusted position and orientation. Locking may be provided in an easily releasable manner or a non easily releasable manner, i.e. via a suitable bonding technique between the facet element 109 and/or the connector section 108.3 and the base unit 108.5 (as well as, eventually, between the linking element 108.4 and the base unit 108.5). Such bonding techniques may be used alone or in arbitrary combination to provide proper connection and relative fixation between the facet elements and the support unit. Such suitable bonding techniques include, for example, gluing, soldering, laser soldering, welding, diffusion bonding etc. Furthermore, an easily releasable locking may be provided, e.g. via the clamping connection, which in turn allows modification of the (fine) adjustment of the facet element 109.

Figure 4:
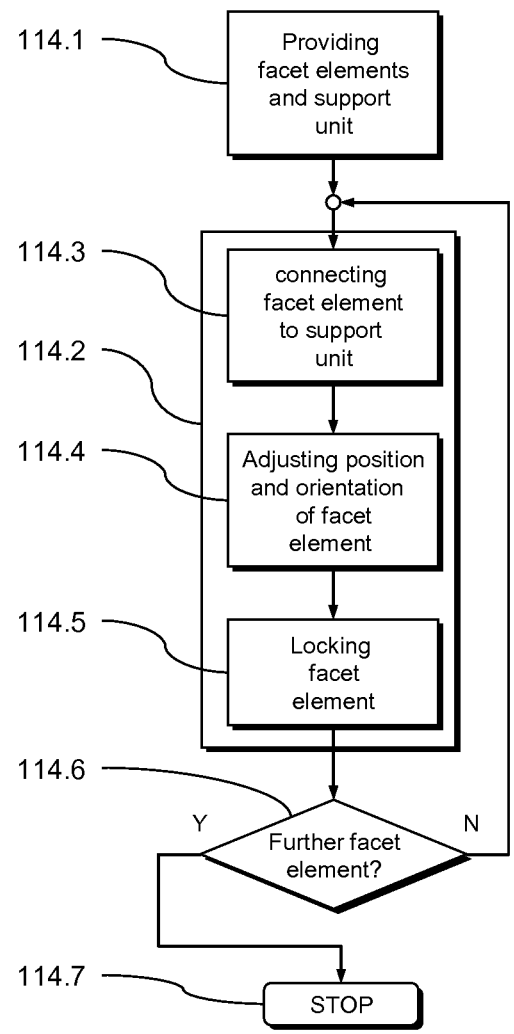
FIG. 4 is a block diagram of a preferred embodiment of a method of supporting a facet mirror element according to the invention which may be used for the optical imaging arrangement of FIG. 1.

As will be explained in the following with reference to FIGS. 3 and 4, adjustment of the position and orientation of the optical surface 109.1 of the individual facet element 109 is performed using a preferred embodiment of the method of supporting a facet element according to the invention.

In a first step 114.1, the support unit 108, the facet elements 109 and the clamping devices 110 as they have been described above are provided. In the embodiment shown, the facet elements are made of silicon (Si), while the support element is made of silicon carbide (SiC). With such a material pairing and beneficial heat transfer from the facet elements 109 (typically reaching temperatures of 100° C. to 150° C. during operation of the imaging arrangement 101) may be obtained.

However, it will be appreciated that, with other embodiments of the invention, the facet element may be made of silicon carbide (SiC), quartz ($SiO_2$), silicon aluminium (SiAl) Zerodur® (a glass ceramic as manufactured by SCHOTT AG, Mainz, Del.), ULE™ (ultra low expansion titanium silicate glass as manufactured by Corning Incorporated, Corning, N.Y. 14831, USA), other glass ceramics as well as copper (Cu) or aluminium (Al) coated with N1P and combined MoSi layers; while the support element may be made of stainless steel, copper (Cu), aluminium (Al), reaction bonded silicon infiltrated silicon carbide (SiSiC), Zerodur®, ULE® (ultra-low-expansion glass) or other glass ceramics. It should be noted that, preferably, a matching of the coefficient of thermal expansion (CTE) is provided for the facet element and the support element.

In a mounting step 114.3 of a support step 114.2 the support unit 108, the facet element 109 and the clamping device 110 are mounted to provide the configuration shown in FIG. 3. In an adjustment step 114.4 of the support step 114.2 adjustment of the position and/or orientation of the respective facet element 109 is provided as will be explained in the following.

As can be seen from FIG. 3, the connector section 108.3 is formed as a substantially tubular element, for example a generally hollow cylindrical element, forming a chamber 108.10 receiving the tensioning element 110.1. The connector section 108.3 has a substantially fluid tight chamber wall which, at its respective end, is closed by the facet element 109 and the counter unit 110.4, respectively.

In the present example, the connector section 108.3 has a pressurizing connector 108.11 for connecting the chamber 108.10 to a pressurizing device 115. It will be appreciated however, that, with other embodiments of the invention, the pressurizing connector may also be formed at either of the facet element 109 or the counter unit 110.4 thereby providing the possibility to pressurize the chamber 108.10.

In the mounted state of the present embodiment as shown in FIG. 3, in the adjustment step 114.3, the pressurizing device 115, under the control of control device 116, provides a pressurizing medium or fluid (i.e. a liquid or a gas) to the chamber 108.10 to pressurize the latter. As a consequence, the increased pressure in the chamber 108.10 generates a first release force FR1 acting on the facet body 109.4 and a second release force FR2 acting on the force transmission element 110.7 of the counter unit 110.4 acting along the longitudinal axis 110.8 of the tensioning element 110.3.

In this context it will be appreciated that the counter unit 110.4 comprises a flexible sealing element, such as a bellows 110.13 sealingly connecting the first counter element 110.9 and the force transmission element 110.7 such that the pressurizing medium may not escape in this area.

Since the tensioning element 110.3 is connected to, both, the facet body 109.4 and the force transmission element 110.7, the first release force FR1 and the second release force FR2 counteract the clamping forces FC1 and FC2, thereby relieving, in a relieved state, the first to eighth support section (i.e. components 109.2, 108.1, 110.5, 108.2, 109.6, 109.7, 110.10, 110.12) at least to a certain degree from the clamping forces FC1 and FC2.

Once this relieved state has been reached, i.e. once the clamping connection provided via the clamping unit 110 is released at least to a certain degree, adjustment of the orientation and/or position of the facet element as it has been outlined above may be performed.

It will be appreciated that the necessary degree of relief from the clamping forces may vary. However, obviously, the lesser the contact force acting between the mating ones of the first to eighth support section (i.e. components 109.2, 108.1, 110.5, 108.2, 109.6, 109.7, 110.10, 110.12) the lower the frictional forces occurring during the respective relative motion in the adjustment process. It will be understood that such frictional forces typically generate undesired parasitic stresses which may be introduced into the mating components, hence, also into the facet element 109.

Consequently, it is preferably provided that the pressure within the chamber 108.10 is increased to an extent where gaps form between the mating ones of the first to eighth support section (i.e. components 109.2, 108.1, 110.5, 108.2, 109.6, 109.7, 110.10, 110.12) such that a certain amount of the pressurizing medium escapes or leaks through these gaps. At that situation a substantially frictionless relative adjustment motion may be achieved which at least largely avoids frictional relative motion and, consequently, among others the introduction of undesired parasitic stresses into the facet element 109.

In the adjustment step 114.4, the position and/or orientation of the facet element 109 with respect to the support unit 108 is adjusted according to the optical requirements for the facet mirror device 106.1 during later operation in the imaging arrangement 101.

To this end, a first adjustment device in the form of a first manipulator 117 controlled by the control device 116 is used to generate a corresponding adjustment forces and/or moments on an adjustment interface 110.14 of the counter unit 110.4 as it is shown in FIG. 3.

It will be appreciated that, with certain embodiments of the invention, a second adjustment device in the form of a second manipulator 118 may be provided. The further manipulator 118, under the control of the control device 116, may act (preferably in synchronicity with the manipulator 117) on the facet element 109 to support the adjustment process. It will be further appreciated that either of the first and second manipulator may be omitted with other embodiments of the invention.

Assessment of the adjustment of the optical surface 109.1 is performed using the measurement results of a measurement device 119. In the present embodiment, the measurement device 119 is an optical device comprising an emitter 119.1 emitting a measurement light beam 119.2 towards the optical surface 109.1. The measurement light beam 119.2 is reflected at the optical surface 109.1 and reaches a sensor 119.3 of the measurement device 119.

In the embodiment shown, the emitter is a conventional emitter using measurement light at a wavelength of 633 nm. Hence, it may be necessary to provide a measurement section at the optical surface 109.1 having a reflective coating adapted to this wavelength of the measurement light (provided that the reflective coating of the front surface 109.1 adapted to the exposure light does not provide sufficient reflection at the measurement light wavelength). However, it will be appreciated that, with other embodiments of the invention, other wavelengths may be used for the measurement light, such that, eventually, no such additional measurement section may be necessary.

The signals of the sensor 119.3 are forwarded to the control device 116 which, in turn, performs the assessment of the adjustment of the optical surface 109.1 using these signals. It will be appreciated that the control device 116, as a function of the signals of the sensor 119.3, controls the manipulators 117 and 118 to provide rapid proper adjustment of the optical surface 109.1.

It will be appreciated that, in a first part of an adjustment step 114.4, a first (raw) adjustment of the position and/or orientation of the facet element may be provided using the adjustment possibilities provided via the first to eighth support section (i.e. components 109.2, 108.1, 110.5, 108.2, 109.6, 109.7, 110.10, 110.12) and the pressurizing device 115 as outlined above.

Once this first adjustment has been completed, the pressure within the chamber 108.10 may be reduced such that the clamping forces FC1 and FC2 provided via the tensioning element 110.1 act, thereby clamping the facet element in its adjusted position and orientation with respect to the second support section 109.2.

Subsequently, in a second part of this adjustment step 114.4, a second (fine) adjustment may be executed using the manipulators 117 and 118 controlled by the control device 116 as a function of the signals of the sensor device 119.

It will be appreciated however that, with other embodiments of the invention, such a second adjustment part may be omitted and, in particular, fine adjustment of the position and/or orientation of the facet element 109 may be provided exclusively in the first part of the adjustment step.

It will be appreciated that, in the embodiment shown, orientation of the optical surface 109.1 is adjusted at an angular accuracy of less than 100 µrad, while the position of the optical surface 109.1 is adjusted at a positional accuracy of less than 100 µm. However, it will be appreciated that, with other embodiments of the invention, depending on the optical requirements during later operation of the imaging arrangement 101, any other angular accuracy may be chosen.

As mentioned, the respective accuracy depends on the specific application of the imaging arrangement as well as, eventually, from the location and/or function of the facet mirror device within the imaging arrangement. Furthermore, a difference may be made between a static accuracy (to be achieved with an initial adjustment, e.g. at ambient temperature) and a thermally dynamic accuracy (i.e. a maximum deviation between the static state and a substantially stationary state after reaching an elevated operational temperature maintained during operation, typically, such a stationary situation is reached after 30 seconds).

For example, with preferred embodiments of the invention, a static positional accuracy of less than 150 µm, preferably of less than 100 µm, more preferably of less than 20 µm to 30 µm, is selected for a field facet mirror device, while for a pupil facet mirror device a more strict static positional accuracy of less than 100 µm, preferably of less than 50 µm, more preferably of less than 20 µm to 30 µm, is selected. It will be appreciated that the positional accuracy may also vary depending on the translational degree of freedom. Typically, strict positional accuracy requirements apply in the x and/or y direction while more relaxed requirements apply for the z direction.

Similar applies to the angular accuracy. For example, with preferred embodiments of the invention, a static angular accuracy of less than 1000 µrad, preferably of less than 500 µrad, more preferably of less than 100 µrad to 300 µrad, is selected for a field facet mirror device, while for a pupil facet mirror device a more strict angular accuracy of less than 1000 µrad, preferably of less than 500 µrad, more preferably of less than 50 µrad to 150 µrad, is selected. It will be appreciated that the angular accuracy may also vary depending on the rotational degree of freedom. Typically, more strict angular accuracy requirements apply about the x and/or y direction while more relaxed requirements apply about the z direction.

As far as the thermally dynamic positional accuracy is concerned, with preferred embodiments of the invention, a dynamic positional accuracy of less than 5 µm, preferably of less than 3 µm, more preferably of less than 0.2 µm to 0.4 µm, is selected for, both, a field facet mirror device and a pupil facet mirror device. It will be appreciated that the positional accuracy may also vary depending on the translational degree of freedom. Typically, again, more strict positional accuracy requirements apply in the x and/or y direction while more relaxed requirements apply for the z direction.

Similar applies to the angular accuracy. For example, with preferred embodiments of the invention, a dynamic angular accuracy of less than 15 µrad, preferably of less than 1 µrad, more preferably of less than 0.2 µrad to 0.4 µrad, is selected for, both, a field facet mirror device and a pupil facet mirror device. It will be appreciated that the angular accuracy may also vary depending on the rotational degree of freedom. Typically, again, more strict angular accuracy requirements apply about the x and/or y direction while more relaxed requirements apply about the z direction.

Once the adjustment of the facet element 109 is completed, in a facet fixation step 114.5 of the supporting step 114.2, the facet element 109 is (either permanently or releasably) locked or fixed in place as it has been outlined above.

In a step 114.6 is checked in the further facet element is to be supported. If this is the case, the support step 114.2 is repeated. Otherwise the method ends at step 114.7.

As can be seen from FIG. 3, the base unit 108.5 comprises a base plate 108.9 and an adjacent cooling body 108.10, both forming a receptacle 108.12 receiving the connector section 108.3. Either of the base plate 108.9 and the cooling body 108.10 may be provided with cooling ducts 120.1 through which a cooling medium is circulated.

With certain embodiments of the invention, the flexure part 108.8 may be designed as a fluid tight component. For example, this may be done by using a membrane element for the flexure part 108.8. In this case, a sealing unit as indicated by the dashed contour 120.2 may be connected to the cooling body 108.10 in the area of the counter unit 110.4 and a cooling medium may also be circulated through the receptacle 108.12 to provide enhanced cooling of the facet element 109. It will be appreciated that the sealing unit 120.2 may cover a wider area of the rear surface of the cooling body 108.10 (up to the entire rear surface of the cooling body 108.10).

With certain embodiments of the invention, this cooling medium may also be introduced into (preferably even circulated through) the chamber 108.10, provided that the clamping forces FC1 and FC2 are sufficiently high to avoid leakage or a cooling medium is used leakage of which is irrelevant during operation of the imaging apparatus 101.

Second Embodiment

In the following, a second embodiment of the facet mirror device 206.1 according to the invention will be described with reference to FIGS. 1, 2, 4 and 5. The facet mirror device 206.1 in its basic design and functionality largely corresponds to the facet mirror device 106.1 and may replace the facet mirror device 106.1 in the optical imaging device 101 of FIG. 1. In particular, the method of supporting a facet element as they have been described above in relation to the first embodiment (FIG. 4) may be executed as well in the context of this facet mirror device 206.1. Thus, it is here mainly referred to the explanations given above and only the differences with respect to the facet mirror device 106.1 will be explained in further detail. In particular, similar parts are given the same reference numeral raised by the amount 100 and (unless explicitly described in the following) in respect to these parts reference is made to the explanations given above in the context of the first embodiment.

One difference with respect to the facet mirror device 106.1 lies within the design of the connection of the facet element 209 to the support unit 208. More precisely, as can be seen from FIG. 5, the linking element 208.4 is a first linking element and again comprises a cylindrical first inner linking part 208.6 forming the second support section 208.1 (contacting a first support section 209.2 of the facet element 209). The first inner linking part 208.6 is connected to a concentric first outer linking part 208.7 via a first flexure part 208.8. Again, the first linking element 208.4, in the present embodiment, is rotatably connected to the base unit 208.5 of the support unit 208. Furthermore, again, in an initial state as shown in FIG. 5, the longitudinal axes of the first inner linking part 208.6 and of the first outer linking part 208.7 are collinear with the longitudinal axis 210.8 of the tensioning element 210.1.

In the present embodiment, however, the first flexure part 208.8 is formed by a plurality of elastic first flexure elements 208.13 (e.g. a plurality of leaf spring elements or elastic struts). In the embodiment shown in FIG. 5, are provided a plurality of three or more first flexure elements in the form of first elastic struts 208.13. The first elastic struts 208.13 are preferably evenly distributed at the circumference of the inner linking part 208.6. The first elastic struts 208.13 are arranged such that their longitudinal axes 208.14 intersect at substantially one common point of intersection 211 defining and representing the first center of rotation of the facet element 209. Hence, the first elastic struts 208.13, in the manner of a spherical bearing, by their elastic deformation allow relative rotational motion between the facet element 209 and the support unit 208 about arbitrary rotational axes.

It will be appreciated however that, with other embodiments of the invention, a specific first rotational axis having a given orientation in space may be defined by the first flexure elements. For example, the first flexure part might be formed by two first flexure elements 208.13 in the form of leaf springs, the planes 208.14 of which intersect at a defined line of intersection forming this specified first rotational axis (the first center of rotation 211 then being an arbitrary point on this first axis of rotation).

Figure 5:
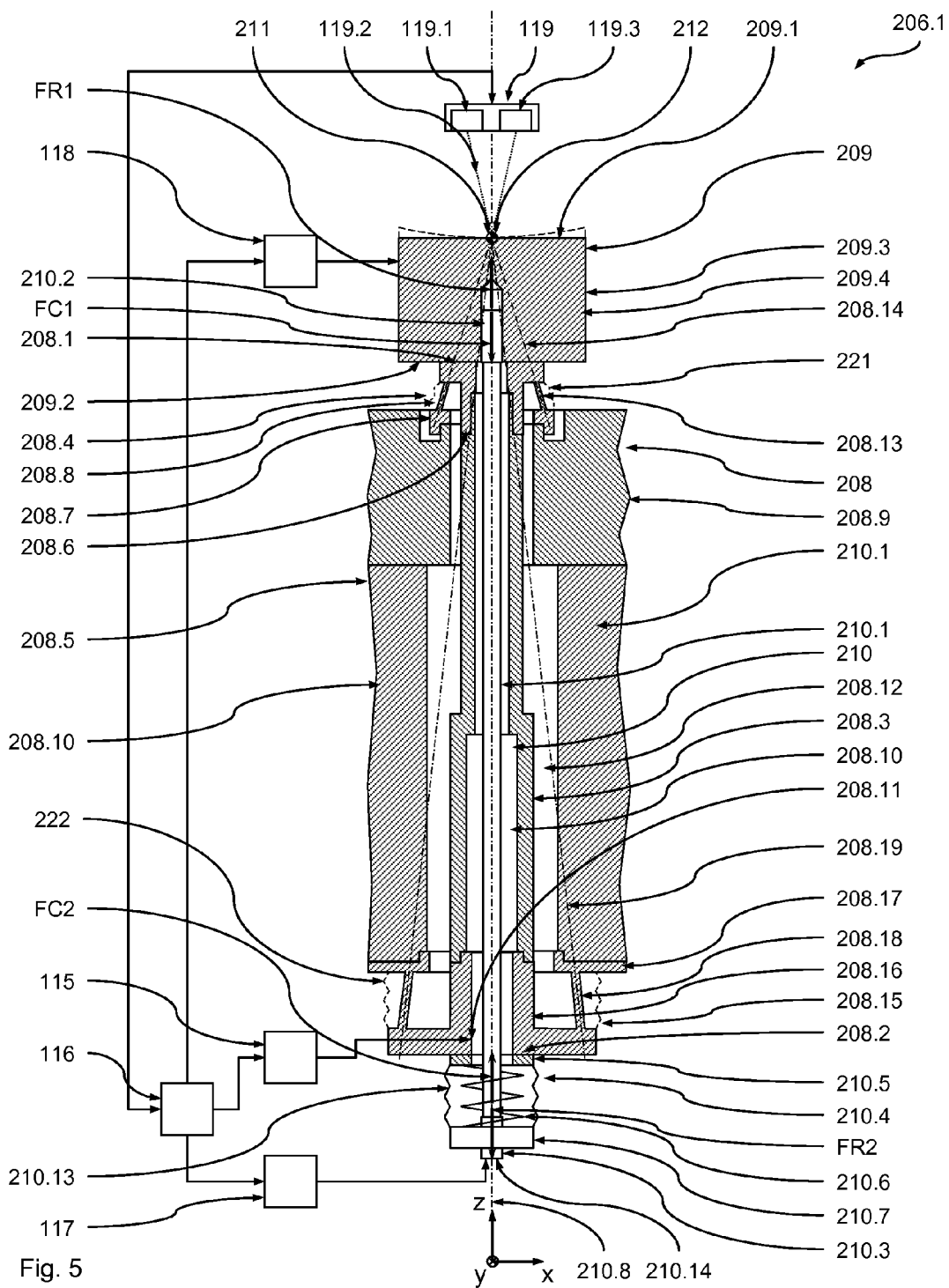
FIG. 5 is a schematic sectional representation of a detail of a further preferred embodiment of a facet mirror device according to the invention.

As can be seen further from FIG. 5, in the present example, in a similar manner the connector section 208.3 comprises a second linking element 208.15. The second linking element 208.15 comprises a cylindrical second inner linking part 208.16 forming the fourth support section 208.2 (contacting a third support section 210.5 of the calendar unit 210.4). The second inner linking part 208.16 is connected to a concentric second outer linking part 208.17 via a second flexure part 208.18. Here again, the second linking element 208.4, in the present embodiment, is rotatably connected to the base unit 208.5 of the support unit 208. Furthermore, again, in an initial state as shown in FIG. 5, the longitudinal axes of the second inner linking part 208.16 and of the second outer linking part 208.17 are collinear with the longitudinal axis 210.8 of the tensioning element 210.1.

The second flexure part 208.18 again is formed by a plurality of elastic second flexure elements 208.19 (e.g. a plurality of leaf spring elements or elastic struts). In the embodiment shown in FIG. 5, are provided a plurality of three or more second flexure elements in the form of second elastic struts 208.19. The second elastic struts 208.19 are preferably evenly distributed at the circumference of the second inner linking part 208.16. The second elastic struts 208.19 are arranged such that their longitudinal axes 208.20 intersect at substantially one common point of intersection 212 defining and representing the second center of rotation of the facet element 209. Hence, the second elastic struts 208.19, in the manner of a spherical bearing, by their elastic deformation allow relative rotational motion between the facet element 209 and the support unit 208 about arbitrary rotational axes.

It will be appreciated however that, with other embodiments of the invention, a specific second rotational axis having a given orientation in space may be defined by the second flexure elements. For example, the second flexure part might be formed by two first flexure elements 208.19 in the form of leaf springs, the planes 208.20 of which intersect at a defined line of intersection forming this specified second rotational axis (the second center of rotation 211 then being an arbitrary point on this first axis of rotation).

As can be seen from FIG. 5, the dimensions of the facet element 209, the support unit 208 and the clamping device 210 are selected such that the first center of rotation 211 and the second center of rotation 212 substantially coincide. Such a configuration has the great advantage that, in an adjustment situation, irrespective of the presence of the clamping forces FC1, FC2 of the tensioning element 210.1, the facet element 209 and the counter unit 210.4 may execute frictionless synchronous rotational motion about the substantially coinciding first and second center of rotation 211, 212 and substantially coinciding first and second axes of rotation, respectively, to adjust the orientation of the facet element 209 (in particular, about the x-axis and/or the y-axis).

Such a synchronous frictionless rotational motion about coinciding first and second centers of rotation 211, 212 and substantially coinciding first and second axes of rotation, respectively, avoids the generation of undesired parasitic stresses which might otherwise be introduced into the facet element 209.

It will be appreciated that, as with the first embodiment, any desired location of the center of rotation 211, 212 may be selected in the function of the adjustment motion to be achieved.

As can be further seen from FIG. 5, both ends of the connector section 208.3 (in the direction of the longitudinal axis 210.8 of the tensioning element 210.1) abut against the first and second inner linking part 208.6, 208.16, such that the first and second flexure parts 208.8, 208.18 are at least widely relieved from the clamping forces FC1, FC2. Hence, any deformation of the first and second flexure parts 208.8, 208.18 which might influence the location of the respective first and second center of rotation 211, 212 may be avoided.

It will be appreciated that, with other embodiments of the invention, either of the first linking element 208.4 and the second linking element 208.15 (more precisely the connection of the respective inner linking part to the support unit 208.5) may be omitted, since one of both may be sufficient to provide the desired center of rotation 211 and 212, respectively, for the facet element 209.

It will be further appreciated that, in a manner similar to the one described above pressurizing the chamber 208.10 may be used to relieve the first support section 209.2 and the second support section 208.1 as well as the third support section 210.5 and the fourth support section 208.2 from the clamping forces FC1, FC2 (i.e. to release the clamping connection of the clamping device 210) again allowing substantially frictionless adjustment of the position of the facet element in the x- and y-direction.

Again, synchronous translatory motion of the facet body 209.4 and the force transmission element 210.7 of the counter unit 210.4 allows maintenance of the first and second clamping forces FC1 and FC2 in a substantially collinear arrangement. This again has the advantage that that no resetting forces or moments are generated which otherwise would tend to counteract the adjustment motion that has been performed and would introduce undesired parasitic forces or moments into the facet element 209.

It will be appreciated that, here again, the first and second linking element 208.4, 208.16, may be sealed by a sealing element, e.g. a bellows 221 and 222, respectively, to be able to circulate a cooling medium within the receptacle 208.12.

In the foregoing, the invention has been described in the context of embodiments where the optical module according to the invention is used in the illumination unit. However, it will be appreciated that the optical module according to the invention may provide its beneficial effects as well in the optical projection unit.

In the foregoing, the invention has been described in the context of embodiments working in the EUV range. However, it will be appreciated that the invention may also be used at any other wavelength of the exposure light, e.g. in systems working at 193 nm etc.

Finally, in the foregoing, the invention has been described solely in the context of microlithography systems. However, it will be appreciated that the invention may also be used in the context of any other optical device using facet mirror devices.

What is claimed is:

1. A facet mirror device, comprising:
   a facet element having a first section;
   a support device having first and second sections;
   a counter unit having a first section; and
   a clamping device comprising a tensioning element having first and second ends,
   wherein:
     the first section of the facet element contacts the first section of the support device to support the facet element;
     the first end of the tensioning element is connected to the facet element;
     the second end of the tensioning element is connected to the counter unit;
     the second section of the support device contacts the first section of the counter unit to support the counter unit;
     in a clamping state, the tensioning element is under tensile stress so that the first section of the facet element and the first section of the support device are pressed against each other and the first section of the counter unit and the second section of the support device are pressed against each other in a clamping direction to clamp the facet element via a clamping force in a position and an orientation;
     the first section of the facet element and the first section of the support device define a first axis of rotation of a relative motion between the first section of the facet element and the first section of the support device;
     the first axis of rotation extends in a first plane transverse to the clamping direction;
     the first section of the counter unit and the second section of the support device define a second axis of rotation of a relative motion between the first section of the counter unit and the second section of the support device; and
     the second axis of rotation extends in a second plane transverse to the clamping direction;
     the first and second axes of rotation are located at least close to each other.

2. The facet mirror device of claim 1, wherein the first and second axes of rotation substantially coincide, and/or the first and second axes of rotation are substantially parallel.

3. The facet mirror device of claim 1, wherein at least one of the following holds:
   the first section of the facet element and the first section of the support device define a first center of rotation of the relative motion between the first section of the facet element and the first section of the support device;
   the first section of the counter unit and the second section of the support device define a second center of rotation of the relative motion between the first section of the counter unit and the second section of the support device; and
   the first and the second centers of rotation are located at least close to each other.

4. The facet mirror device of claim 3, wherein the first center of rotation and the second center of rotation substantially coincide.

5. The facet mirror device of claim 1, wherein at least one of the following holds:
   the first section of the facet element and/or the first section of the support device has a curved contact surface that defines the first axis of rotation; and
   the first section of the counter unit and/or the second section of the support device has a curved contact surface that defines the second axis of rotation.

6. The facet mirror device of claim 1, wherein:
   the facet element comprises a facet body defining a second section of the facet element;
   the facet element comprises an intermediate element defining the first section of the facet element and a third section of the facet element;
   the third section of the facet element contacts the second section of the facet element;
   the counter unit comprises a first counter element defining a second section of the counter unit;
   the counter unit comprises a second counter element defining the first section of the counter unit and a third section of the counter unit;
   the third section of the counter unit contacts the second section of the counter unit; and
   in the clamping state, the tensioning element is under tensile stress such that the second and third sections of the facet element are pressed against each other and the second and third sections of the counter unit are pressed against each other in the clamping direction to clamp the facet body via the clamping force the position and the orientation.

7. The facet mirror device of claim 6, wherein at least one of the following holds:
   the second section of the facet element and/or the third section of the facet element has a substantially planar contact surface, and
   the second section of the counter unit and/or the third section of the counter unit has a substantially planar contact surface.

8. The facet mirror device of claim 1, wherein:
   the support device comprises a connector section connecting the first and second sections of the support element; and
   the connector section receives the tensioning element.

9. The facet mirror device of claim 8, wherein:
   the connector section defines a chamber receiving the tensioning element and having a substantially fluid tight chamber wall; and the chamber is closed by the first section of the facet element and the first section of the counter unit.

10. The facet mirror device of claim 9, wherein:
at least member selected from the group consisting of the first section of the facet element, the first section of the counter unit and the connector section has a connector configured to connect the chamber to a pressurizing device; and
the pressurizing device is configured so that, in a mounted stated on the facet mirror device, the pressurizing device pressurizes the chamber to relieve from the clamping force at least a section combination selected from the section combination group consisting of: a) the first section of the facet element and the first section of the support device; and b) the first section of the counter unit and the second section of the support device.

11. The facet mirror device of claim 1, wherein the counter unit further comprises a spring device, the counter unit is connected to the tensioning element via the spring device, and the spring device is configured to generate part of the clamping force.

12. The facet mirror device of claim 1, wherein the first section of the support device is movably connected to a base unit of the support device via a linking element.

13. The facet mirror device of claim 12, wherein at least one of the following holds:
the linking element comprises a flexible element;
the linking element comprises a leaf spring element and/or a membrane element;
the linking element is rotatably connected to the base unit; and
the linking element is monolithically connected to at least member selected from the group consisting of the first section of the support device and the base unit.

14. The facet mirror device of claim 1, wherein the first and second axes of rotation are located at least close to an optical surface of the facet element.

15. The facet mirror device of claim 1, wherein:
the facet element comprises a curved optical surface defining at least one center of curvature of the optical surface; and
the first axis and second axes of rotation are located at least close to the center of curvature of the optical surface.

16. The facet mirror device of claim 1, wherein:
the facet element comprises a material selected from a first material group consisting of silicon, silicon carbide, quartz, nickel plated copper, aluminum and steel; and
the support device comprises a material selected from a second material group consisting of silicon carbide, silicon infiltrated silicon carbide, tungsten carbide, copper, aluminum and steel.

17. An arrangement, comprising:
a mask unit adapted to receive a pattern,
a substrate unit adapted to receive a substrate;
an illumination unit configured to illuminate a first object; and
an optical projection unit configured to transfer an image of at least a portion of the first object onto the second objection,
wherein at least one unit comprises a facet mirror device according to claim 1, and the at least one unit is selected from the group consisting of the illumination unit and the optical projection unit.

18. The facet mirror device of claim 1, wherein the first end of the tensioning element contacts the facet element.

19. The facet mirror device of claim 1, wherein the tensioning element extends into an opening in the facet element.

20. The facet mirror of claim 1, further comprising a spring element configured to adjust the clamping force.

21. The facet mirror of claim 1, further comprising a spring between the second end of the tensioning element and the support section of the counter unit.

22. A method of operating a facet device that comprises a facet element having a section, a support device having first and second sections, a counter unit having a section, and a clamping device comprising a tensioning element having first and second ends, the method comprising:
connecting the first end of the tensioning element to the facet element;
connecting the second end of the tensioning element to the counter unit;
putting the tensioning element under tensile stress so that the section of the facet element and the first section of the support device are pressed against each other and the the section of the counter unit and the second section of the support device are pressed against each other in a clamping direction to clamp the facet element via a clamping force in a position and an orientation;
relieving at least the section of the facet element and the first section of the support device from the clamping force; and
adjusting the facet element to a given position and a given orientation.

23. The method of claim 22, wherein relieving at least the section of the facet element and the first section of the support device from the clamping force comprises relieving the section of the counter unit and the second section of the support device from the clamping force.

24. A facet mirror device, comprising:
a facet element having a section,
a support device having first and second sections;
a counter unit having a section; and
a clamping device comprising a tensioning element having first and second ends;
wherein:
the first section of the support device contacts the section of the face element to support the facet element;
the first end of the tensioning element is connected to the facet element;
the second end of the tensioning element is connected to the counter unit;
the second section of the support device contacts the section of the counter unit to support the counter unit;
in a clamping state, the tensioning element is under tensile stress so that the first section of the facet element and the first section of the support device are pressed against each other and the the section of the counter unit and the second section of the support device are pressed against each other to clamp the facet element in a position and/or an orientation;
the first section and/or the second section of the support device defines an axis of rotation of the facet element;
the first section and/or the second section of the support device allows substantially frictionless rotation of the facet element about the axis of rotation.

25. An arrangement, comprising:
a mask unit adapted to receive a pattern,
a substrate unit adapted to receive a substrate;
an illumination unit configured to illuminate a first object; and
an optical projection unit configured to transfer an image of at least a portion of the first object onto the second objection,
wherein at least one unit comprises a facet mirror device according to claim 24, and the at least one unit is selected from the group consisting of the illumination unit and the optical projection unit.

* * * * *

UNITED STATES PATENT AND TRADEMARK OFFICE
CERTIFICATE OF CORRECTION

PATENT NO. : 9,465,208 B2  Page 1 of 1
APPLICATION NO. : 14/108487
DATED : October 11, 2016
INVENTOR(S) : Martin Vogt et al.

It is certified that error appears in the above-identified patent and that said Letters Patent is hereby corrected as shown below:

In the Specification

Column 1, below "FACET MIRROR DEVICE", insert
-- Cross-Reference to Related Applications
The present application is a continuation of, and claims benefit under 35 U.S.C. 120 to, international application PCT/EP2011/060358, filed June 21, 2011. The entire disclosure of international application PCT/EP2011/060358 is incorporated by reference herein. --.

Column 1, Line 43, after "errors", insert -- . --.

Column 4, Line 48, after "line", insert -- III-III --.

Column 9, Line 33, delete "that that" and insert -- that --.

Column 12, Line 67, delete "Del.)," and insert -- DE), --.

Column 18, Line 66, delete "that that" and insert -- that --.

In the Claims

Column 22, Line 24, Claim 22, delete "the the" and insert -- the --.

Column 22, Line 58, Claim 24, delete "the the" and insert -- the --.

Signed and Sealed this
Twenty-fifth Day of April, 2017

Michelle K. Lee
*Director of the United States Patent and Trademark Office*